United States Patent
Ye et al.

(10) Patent No.: US 10,795,266 B2
(45) Date of Patent: *Oct. 6, 2020

(54) METHOD OF PERFORMING MODEL-BASED SCANNER TUNING

(71) Applicant: ASML NETHERLANDS B.V., Veldhoven (NL)

(72) Inventors: Jun Ye, Palo Alto, CA (US); Yu Cao, Saratoga, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/893,305

(22) Filed: Feb. 9, 2018

(65) Prior Publication Data

US 2018/0231896 A1 Aug. 16, 2018

Related U.S. Application Data

(63) Continuation of application No. 14/880,018, filed on Oct. 9, 2015, now Pat. No. 9,921,485, which is a (Continued)

(51) Int. Cl.
*G03F 7/20* (2006.01)

(52) U.S. Cl.
CPC .......... *G03F 7/705* (2013.01); *G03F 7/70125* (2013.01); *G03F 7/70458* (2013.01); *G03F 7/70516* (2013.01); *G03F 7/70525* (2013.01)

(58) Field of Classification Search
CPC ............................ G03F 7/70525; G03F 7/705
See application file for complete search history.

(56) References Cited

U.S. PATENT DOCUMENTS 4,801,977 A 1/1989 Ishizaka et al.
5,229,872 A 7/1993 Mumola
(Continued)

FOREIGN PATENT DOCUMENTS

CN 1683998 10/2005
CN 1758139 4/2006
(Continued)

OTHER PUBLICATIONS

Search Report dated Sep. 22, 2008 in corresponding Singapore matter.
(Continued)

*Primary Examiner* — Steven Whitesell Gordon
(74) *Attorney, Agent, or Firm* — Pillsbury Winthrop Shaw Pittman LLP

(57) ABSTRACT

A model-based tuning method for tuning a first lithography system utilizing a reference lithography system, each of which has tunable parameters for controlling imaging performance. The method includes the steps of defining a test pattern and an imaging model; imaging the test pattern utilizing the reference lithography system and measuring the imaging results; imaging the test pattern utilizing the first lithography system and measuring the imaging results; calibrating the imaging model utilizing the imaging results corresponding to the reference lithography system, where the calibrated imaging model has a first set of parameter values; tuning the calibrated imaging model utilizing the imaging results corresponding to the first lithography system, where the tuned calibrated model has a second set of parameter values; and adjusting the parameters of the first lithography system based on a difference between the first set of parameter values and the second set of parameter values.

24 Claims, 10 Drawing Sheets

Related U.S. Application Data continuation of application No. 13/182,416, filed on Jul. 13, 2011, now Pat. No. 9,158,208, which is a continuation of application No. 11/892,407, filed on Aug. 22, 2007, now Pat. No. 7,999,920.

(56) References Cited

U.S. PATENT DOCUMENTS

| | | | |
|---|---|---|---|
| 5,296,891 | A | 3/1994 | Vogt et al. |
| 5,523,193 | A | 6/1996 | Nelson |
| 5,621,652 | A * | 4/1997 | Eakin .................. G06F 17/5009 716/106 |
| 5,966,312 | A * | 10/1999 | Chen ........................ H01L 22/20 257/E21.525 |
| 5,969,411 | A | 10/1999 | Fukaya |
| 6,020,950 | A | 2/2000 | Shiraishi |
| 6,046,792 | A | 4/2000 | Van Der Werf et al. |
| 6,081,659 | A | 6/2000 | Garza et al. |
| 6,499,007 | B1 | 12/2002 | Kuroki et al. |
| 6,691,052 | B1 | 2/2004 | Maurer |
| 7,242,459 | B2 | 7/2007 | Shi et al. |
| 7,425,397 | B2 | 9/2008 | Finders et al. |
| 7,670,730 | B2 | 3/2010 | Streefkerk et al. |
| 7,820,341 | B2 | 10/2010 | Laidig et al. |
| 7,864,296 | B2 | 1/2011 | Takahashi et al. |
| 7,921,383 | B1 | 4/2011 | Wei |
| 7,999,920 | B2 | 8/2011 | Ye et al. |
| 9,158,208 | B2 | 10/2015 | Ye et al. |
| 2002/0122162 | A1 | 9/2002 | Nakauchi et al. |
| 2003/0115005 | A1 | 6/2003 | Firth et al. |
| 2003/0192015 | A1 | 10/2003 | Liu |
| 2004/0126672 | A1 | 7/2004 | Li |
| 2004/0158808 | A1 * | 8/2004 | Hansen .................. G03F 7/701 430/30 |
| 2005/0179886 | A1 * | 8/2005 | Shi ............................ G03F 1/36 355/77 |
| 2006/0044542 | A1 | 3/2006 | Park et al. |
| 2006/0158626 | A1 | 7/2006 | Baselmans et al. |
| 2006/0234136 | A1 | 10/2006 | Kim |
| 2006/0268254 | A1 | 11/2006 | Percin et al. |
| 2007/0031745 | A1 * | 2/2007 | Ye ........................... G03F 7/705 430/30 |
| 2007/0032896 | A1 | 2/2007 | Ye et al. |
| 2007/0048627 | A1 | 3/2007 | Hickman |
| 2007/0059614 | A1 | 3/2007 | Finders et al. |
| 2007/0121090 | A1 | 5/2007 | Chen et al. |
| 2007/0213967 | A1 | 9/2007 | Park et al. |
| 2008/0073589 | A1 | 3/2008 | Adel et al. |
| 2008/0304029 | A1 | 12/2008 | Pforr et al. |
| 2010/0058263 | A1 | 3/2010 | Tyminski et al. |

FOREIGN PATENT DOCUMENTS

| | | |
|---|---|---|
| CN | 1808279 | 7/2006 |
| EP | 1 630 617 | 3/2006 |
| JP | 09-330862 | 12/1997 |
| JP | 2000-047103 | 2/2000 |
| JP | 2005-217430 | 8/2005 |
| JP | 2005-327769 | 11/2005 |
| JP | 2006-066925 | 3/2006 |
| JP | 2007-035671 | 2/2007 |
| JP | 2007-035871 | 2/2007 |
| JP | 2007-081393 | 3/2007 |
| JP | 2007-158328 | 6/2007 |
| JP | 2007-189179 | 7/2007 |
| JP | 2008-166483 | 7/2008 |
| TW | 200538890 | 12/2005 |

OTHER PUBLICATIONS

Japanese Office Action dated Mar. 1, 2011 in corresponding Japanese Patent Application No. 2008-209112.

Taiwan Office Action dated Mar. 13, 2015 in corresponding Taiwan Patent Application No. 102102113.

* cited by examiner

METHOD OF PERFORMING MODEL-BASED SCANNER TUNING

This application is a continuation of U.S. patent application Ser. No. 14/880,018, filed Oct. 9, 2015, now allowed, which is a continuation of U.S. patent application Ser. No. 13/182,416, filed on Jul. 13, 2011, now U.S. Pat. No. 9,158,208, which is a continuation of U.S. patent application Ser. No. 11/892,407, filed on Aug. 22, 2007, now U.S. Pat. No. 7,999,920, each of the foregoing applications is hereby incorporated by reference in its entirety.

TECHNICAL FIELD

The technical field of the present invention relates generally to a method and program product for performing model-based scanner tuning and optimization so as to allow for optimization of performance of multiple lithography systems.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

Another goal is to be able to utilize the same "process" for imaging a given pattern with different lithography systems (e.g., scanners) without having to expend considerable amounts of time and resources determining the settings of each lithography system to achieve optimal/acceptable imaging performance. As is known, designers/engineers spend a considerable amount of time and money determining the optimal settings of a lithography system (e.g., scanner), which include numerical aperture (NA), $\sigma_{in}$, $\sigma_{out}$, etc., when initially setting up a given process to work with a particular scanner so that the resulting image satisfies the design requirements. Indeed, this is often a trial and error process wherein the scanner settings are selected and the desired pattern is imaged and then measured to determine if the resulting image is within specified tolerances. If not, the scanner settings are adjusted and the pattern is imaged once again and measured. This process is repeated until the resulting image is within the specified tolerances.

However, as each scanner, even identical model types, exhibit different optical proximity effects (OPEs) when imaging a pattern, the actual pattern imaged on the substrate differs from scanner to scanner due to the different OPEs. For example, different OPEs associated with given scanners can introduce significant CD variations through pitch. As such, it is not possible to simply utilize either scanner to image a given pattern, as the resulting image can vary considerable. Thus, if it is desirable to utilize a different scanner to print a given pattern, the engineers must optimize or tune the new scanner, so that the resulting image satisfies the design requirements. Currently, this is typically accomplished by a trial and error process, which as noted above, is both expensive and time consuming.

As such, there is a need for a method for optimizing a process for imaging a given pattern that allows the process to be utilized with different lithography systems that does not require a trial and error process to be performed to optimize the process and scanner settings for each individual scanner. In other words, there is a need for a method for optimizing the imaging performance of multiple scanners with respect to a given target mask that does not require a trial and error optimization process.

SUMMARY

Accordingly, the present invention relates to a method for tuning lithography systems so as to allow different lithography systems to image a given target pattern utilizing a known process that does not require a trial and error process to be performed to optimize the process and lithography system settings for each individual lithography system.

More specifically, the present invention relates to a model-based tuning method for tuning a first lithography system utilizing a reference lithography system, each of which has tunable parameters for controlling imaging performance. The method includes the steps of defining a test pattern and an imaging model; imaging the test pattern utilizing the reference lithography system and measuring the imaging results; imaging the test pattern utilizing the first lithography system and measuring the imaging results; calibrating the imaging model utilizing the imaging results corresponding to the reference lithography system, where the calibrated imaging model has a first set of parameter values; tuning the calibrated imaging model utilizing the imaging results corresponding to the first lithography system, where the tuned calibrated model has a second set of parameter values; and adjusting the parameters of the first lithography system based on a difference between the first set of parameter values and the second set of parameter values.

The present invention also relates to a method of tuning a lithography system utilizing an imaging model, where both the lithography system and the imaging model each have tunable parameters for controlling imaging performance. The method includes the steps of defining a test pattern; imaging the test pattern utilizing the lithography system and measuring the imaging results, where the lithography system has a first set of parameter values; tuning the imaging model utilizing the imaging results corresponding to the lithography system, the tuned imaging model having a second set of parameter values; adjusting the first set of parameters of the lithography system based on a difference between the first set of parameter values and the second set of parameter values.

In another embodiment, the present invention relates to a method of tuning a lithography system utilizing a target pattern, where the lithography system has tunable parameters for controlling imaging performance. The method includes the steps of defining a test pattern and an imaging model; imaging the target pattern utilizing the first lithography system and measuring imaging results, simulating the imaging of the target pattern utilizing the imaging model and determining simulated imaging results, the imaging model having a first set of parameter values; determining target wafer data based on the simulated imaging results and a difference between the imaging results and the target pattern, and tuning the imaging model utilizing the target wafer data; where the tuned imaging model has a second set of parameter values; adjusting the tunable parameters of the lithography system based on a difference between the first set of parameter values and the second set of parameter values.

The present invention provides significant advantages over prior art methods. Most importantly, embodiments of the present invention provide a systematic and cost effective model-based tuning method for the optimization of imaging performance and OPE matching between different lithography systems, including scanners, which are being utilized to image the same target pattern. As a result, the method readily allows performance matching between different scanners of the same model as well as for performance matching between different model scanners.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

DESCRIPTION

Figure 1:
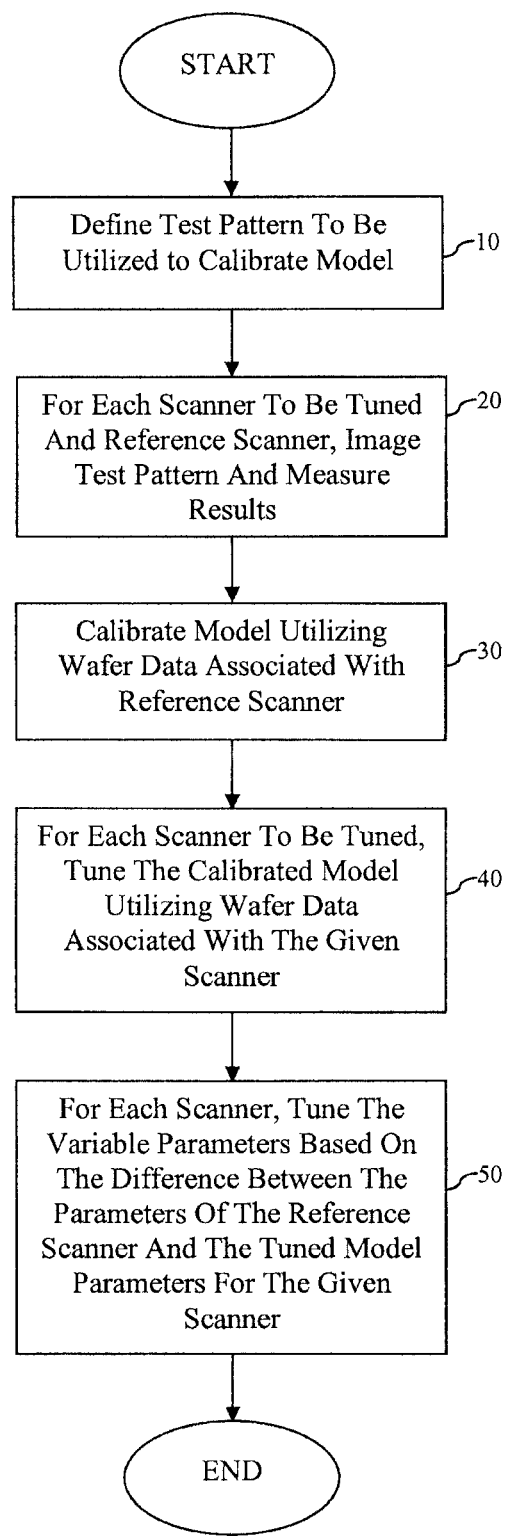
FIG. 1 is an exemplary flowchart illustrating the method of an embodiment of the present invention.

FIG. 1 is an exemplary flowchart illustrating the model-based scanner tuning method of an embodiment of the present invention. As explained in detailed below, an embodiment of the method of the present invention allows for simultaneous optimization of imaging performance and OPE matching between different lithography systems, including scanners, which are being utilized to image the same target pattern.

Referring to FIG. 1, the first step (Step 10) in the process is to define the test pattern that is to be utilized to calibrate the model for a reference scanner. A suitable test pattern (also referred to as model calibration gauge patterns) may be utilized. The test pattern utilized should sufficiently represent the features to be imaged so that a robust model capable of accurately predicting imaging performance of the lithography system may be generated. Such test patterns can be readily generated/selected by those of skill in the art once the target pattern or application is determined. It is noted that it is also possible to utilize the target pattern to be imaged as the test pattern in the calibration process.

Once the test pattern is defined, in the next step (Step 20) each scanner to be tuned (including the reference scanner) images the test pattern and the imaging results are measured. When imaging the test pattern, the parameters, P, of each scanner is set at a predefined nominal value, which is chosen during the process design. Preferably, the same nominal value for each parameter is utilized for each scanner during the imaging of the test pattern. Next, the resulting features in each of the imaged wafers are measured so as to obtain wafer data indicative of the imaging performance of the given scanner. For the purposes of facilitating the following explanation, the measured wafer data (WD) is designated WD_1, WD_2 ... WD_n, where WD_1 corresponds to the wafer data/imaging result of the first scanner, WD_2 corresponds to the wafer data/imaging result of the second scanner and so on up to the nth scanner. It is noted the measurement of the wafer data may be made, for example, by performing various CD measurements or measuring the entire contour of the imaged feature which can be performed utilizing SEM. Typically, the measurements of the wafer data will be defined by the model being utilized to represent the imaging process, plus the design rules defining the relevant pattern space.

Once the wafer data is measured, the next step (Step 30) is to calibrate the model utilizing the wafer data associated with the reference scanner. The model parameters associated with the reference scanner are designated MP_R, and include tunable and non-tunable parameters. As is known, during the calibration process (which is an iterative process), the non-tunable parameters are fixed and the tunable parameters are adjusted until the image generated by the model (i.e., the simulated result) matches the actual imaging result produced by the reference scanner. Thus, the model parameters MP_R are adjusted (i.e., calibrated) such that the imaging results produced by the model equal the actual wafer data associated with the reference scanner WD_R within some predefined error criteria or the best match possible. It is noted that any suitable model for simulating the imaging performance of a scanner may be utilized in this process, for example, the Tachyon FEM (focus-exposure-model) or LithoCruiser™ offered by ASML. It is further noted that any one of the scanners to be tuned and the associated wafer data, WD_1 ... WD-n, may be utilized to calibrate the model. As another alternative, it is possible to average the wafer data for each of the scanners (WD_1 ... WD-n) for each measurement to be input into the model, and utilize these average values as the reference wafer data utilized to calibrate the model parameters MP_R.

In the next step (Step 40), for each scanner to be tuned, the model calibrated in the previous step having parameters MP_R is tuned in accordance with the wafer data WD_i associated with the given scanner (i.e., scanner i). More specifically, utilizing model parameters MP_R as a start point, the non-tunable parameters of MP_R remain fixed and the variable or tunable parameters in MP_R are tuned so that the model for the given scanner, MP_Ri, produces an imaging result which is the same as the actual wafer data WD_i associated with the given scanner (i) within some predefined error criteria or the best match possible. This step is a standard calibration step, which is an iterative process in which the variable model parameters in MP_Ri are adjusted until the output of the imaging model corresponds to the desired image (WD_i). Step 40 is performed for each scanner to be tuned.

Once the model MP_R is tuned for each of the scanners, thereby creating "n" models MP_R1 ... MP_Rn (where n is the number of scanners), in Step 50, each of the scanners is tuned from the nominal parameter values that were utilized to generate the initial wafer data WD_1 ... WD_n utilizing the parameter values of the reference model MP_R and the adjusted model parameters MP_Ri. More specifically, the parameters Pi of each scanner are tuned in accordance with the following equation:

$$Pi = Pi(\text{nominal}) + MP\_R - MP\_Ri,$$

where Pi (nominal) corresponds to the nominal parameters utilized to generate the initial wafer data WD_i; MP_R corresponds to parameters of the calibrated model for the reference scanner, and MP_Ri corresponds to parameters of the calibrated model for the scanner(i). The resulting parameters, Pi, are then utilized to tune the corresponding scanner (i).

It is noted that in the foregoing process, only like parameters are subtracted from one another when executing the foregoing equation. For example, assuming the tunable parameters are (T1, T2 . . . Tm), and their values for the reference model are (T1r, T2r . . . Tmr), and for scanner (i) are (T1i, T2i . . . Tmi), the nominal values, Pi, of these parameters are tuned by a delta equal to (T1r-T1i, T2r-T2i . . . Tmr-Tmi). By performing the foregoing operation it is possible to reduce/minimize the difference between the models such that the two scanners perform in the substantially same manner. Thus, the foregoing process provides a systematic process which allows for the matching of similar scanners (same type and model of machines) as well as for the matching the imaging performance of different scanners (i.e., different models and/or manufacturer). It is noted that the tunable parameters typically include, but are not limited to focus, dose illumination sigma, stage tilt, etc. The fixed parameters include, for example, but are not limited to, resist parameters and etch parameters.

Figure 2:
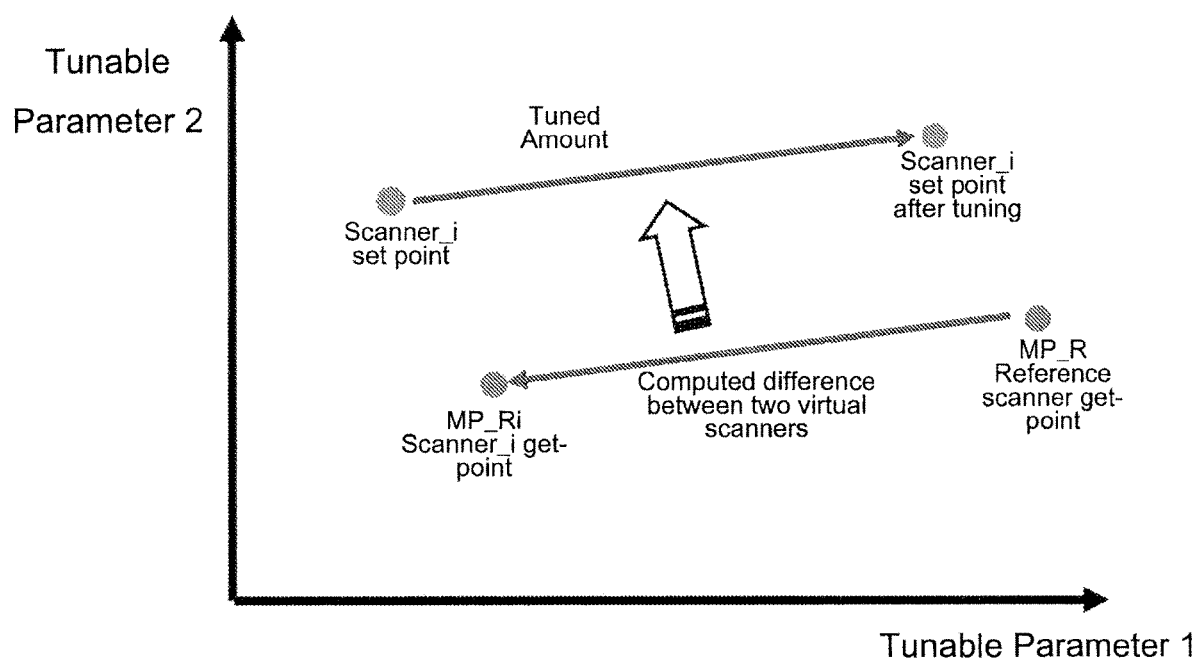
FIG. 2 illustrates a graphical representation of the process set forth in FIG. 1.
Figure 3:
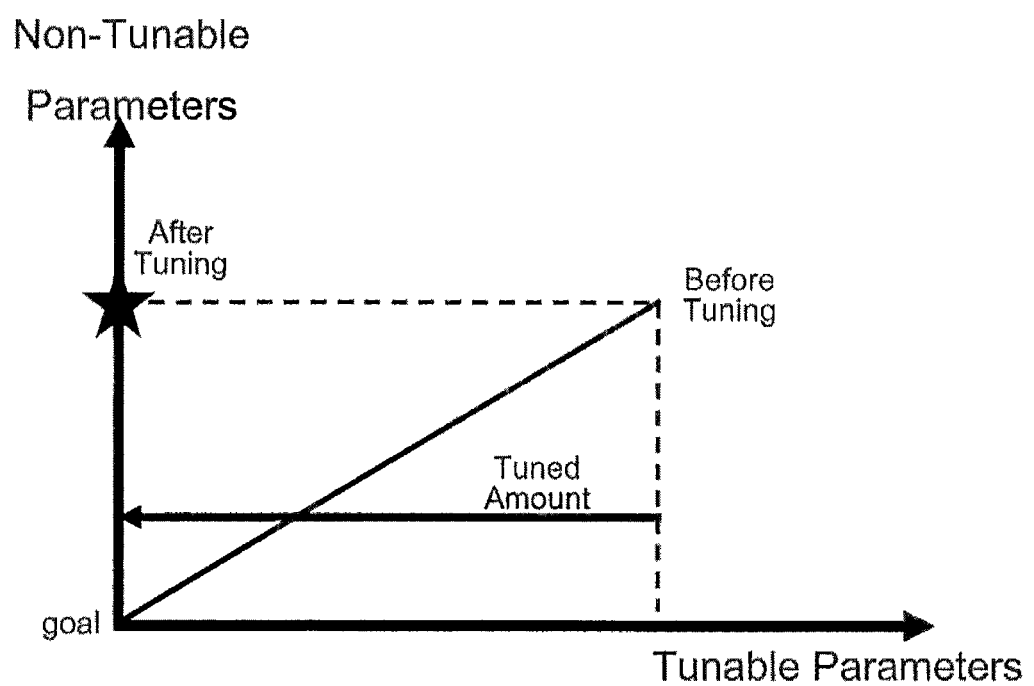
FIG. 3 is a first graphical representation of the space spanned by the tunable and non-tunable parameters of the imaging model illustrating the example where the tunable parameters have an orthogonal effect on the non-tunable parameters.
Figure 4:
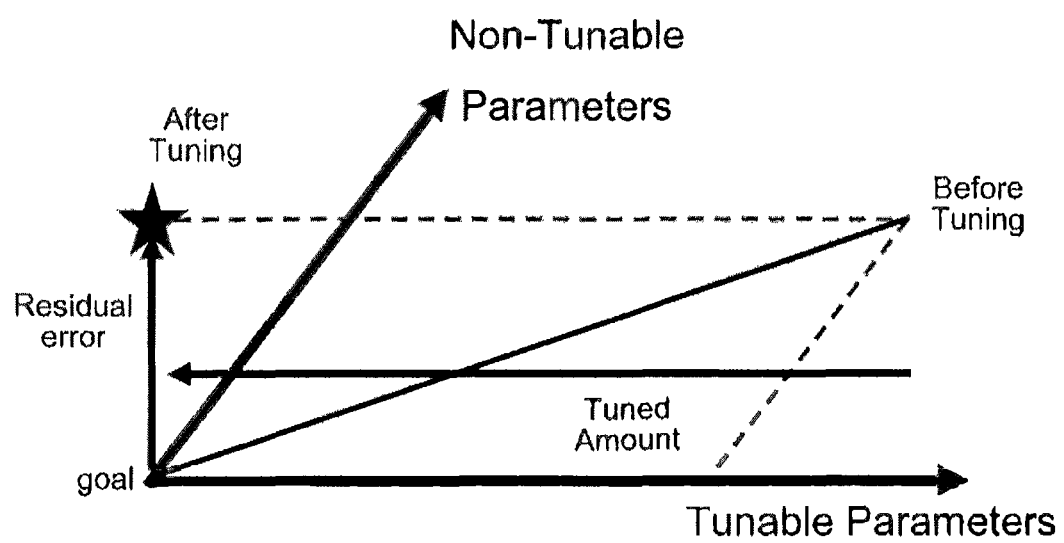
FIG. 4 is a second graphical representation of the space spanned by the tunable and non-tunable parameters of the imaging model illustrating the example where the tunable parameters do not have an orthogonal effect on the non-tunable parameters.

FIG. 2 illustrates a graphical representation of the foregoing process. As shown in FIG. 2, the process effectively computes the difference between two virtual scanners (MP_R and MP_Ri) and then utilizes this computed difference to tune the actual scanners. FIGS. 3 and 4 are graphical representations of the space spanned by the tunable and non-tunable parameters. FIG. 3 illustrates the example where the tunable parameters have an orthogonal effect on the non-tunable parameters, and FIG. 4 illustrates an example where the tunable parameters do not have an orthogonal effect on the non-tunable parameters. As shown, any residual errors are orthogonal to the space spanned by the tunable parameters. In the case where the effects from tunable and non-tunable parameters are not orthogonal, it is possible to compensate to some degree the differences caused by the non-tunable parameters, through tuning the value of the tunable parameters. In an embodiment, the model-based tuning achieves theoretical optimal tuning within the space spanned by the tunable parameters.

Figure 5:
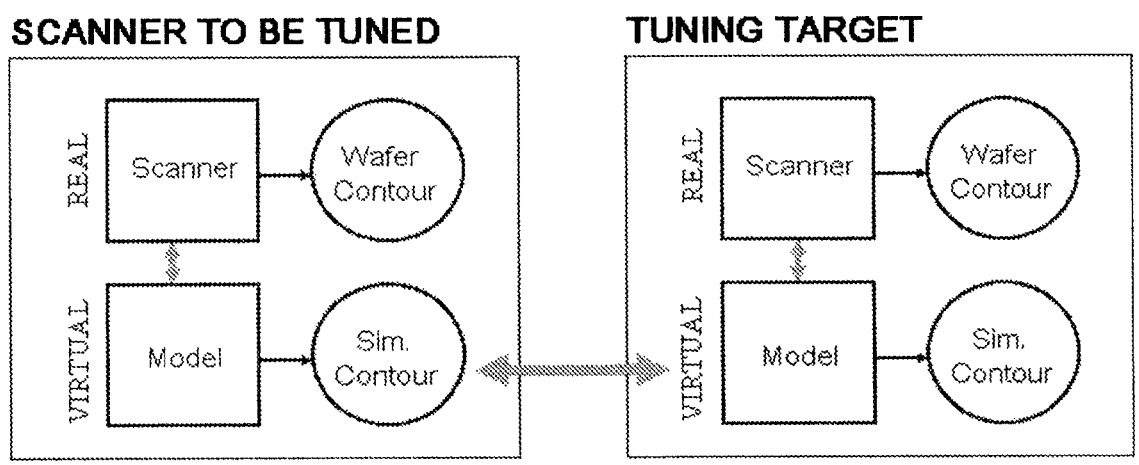
FIG. 5 is a block diagram graphically illustrating the components involved in the model-based scanner tuning process of an embodiment of the present invention.

FIG. 5 is a block diagram graphically illustrating the components involved in the model-based scanner tuning process of an embodiment of the present invention. As shown, the components include a tuning target and a scanner to be tuned. As is clear from the foregoing, while there is always at least one scanner to be tuned, it is possible that there would be multiple scanners to be tuned. The scanner to be tuned is always a physical scanner (i.e., an actual device). However, as explained in further detailed below, the tuning target may be either a real scanner or a virtual scanner or contour. As detailed above, the tuning amount is the difference between the virtual scanner (i.e., model) of the scanner to be tuned and the virtual scanner (i.e., model) of the tuning target. In the model-based tuning process disclosed herein, the model (i.e., virtual scanner) provides the link between the tuning target and the scanner to be tuned.

As noted, it is possible to utilize at least three different tuning targets in the foregoing process. The three possibilities are a physical scanner, a virtual scanner and a desired wafer contour. Examples of the use of the three different tuning targets are described below. The first option is to utilize a physical scanner as the tuning target. A physical scanner was utilized in the example detailed above. Utilizing a physical scanner as the tuning target provides for OPE matching between scanners. In addition, it allows for matching between like scanner units (e.g., SN1 . . . SNn), where SN represents the same scanner model. It also allows for matching between different scanner types from the same manufacturer, as well as for matching between scanners from different manufacturers.

Figure 6:
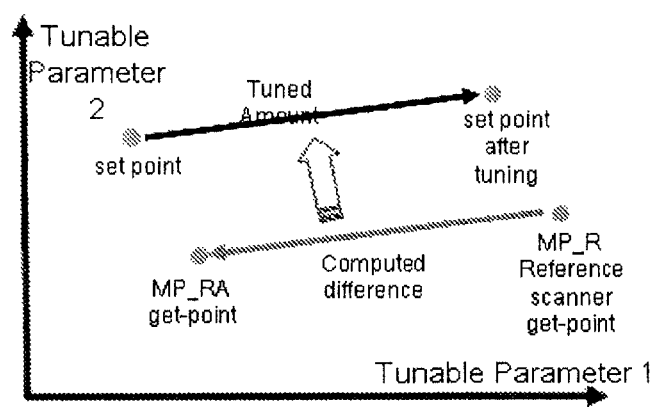
FIG. 6 illustrates a graphical representation of another example of the first embodiment of an embodiment of the present invention.

When performing model-based scanner tuning between different scanner devices, the same process as set forth above in FIG. 1 is utilized. As an example, assuming the to be tuned scanner is scanner A and the tuning target is scanner R, the first step is to print test patterns utilizing nominal scanner parameters, P, on both scanner A and scanner R so as to generate wafer data WD_A and WD_R. Then, the imaging model being utilized is calibrated for scanner R such that the results of the model accurately correspond to WD_R within some predefined criteria. Next, the non-tunable parameters in the model MP_R are fixed and utilized in the model and the tunable parameters are adjusted such that the results of the model (now referred to as MP_RA) associated with scanner A correspond to WD_A within some predefined error criteria. Then, in the final step, the parameters of scanner A, referred to as PA, are tuned from the nominal parameters, P, utilized to produce WD_A to "P+MP_R−MP−RA". FIG. 6 provides a graphical representation of this process.

As an alternative to the foregoing, it is also possible to calibrate the model for scanner A such that the results of the model accurately correspond to WD_A with some predefined error criteria, and then fix the non-tunable parameters in the model MP_A and utilize these parameters in model MP_AR. The tunable parameters of MP_AR are then adjusted such that the results of the model MP_AR associated with scanner R correspond to WD_R within some predefined error criteria. Then, in the final step, the parameters of scanner A, referred to PA, are tuned from the nominal parameters, P, utilized to produce WD_A to "P+MP_AR−MP_A". In yet another variation, it is also possible to utilize an average of the two foregoing processes when determining the amount to tune scanner A. These processes can also be utilized when tuning scanners from different manufacturers.

Next, an example is provided of utilizing a virtual scanner (i.e., model) as the tuning target. The first step in the process is to obtain a known model, referred to as MP_K.

Preferably, the model MP_K is calibrated for the given process being utilized and produces results which are within some predefined error criteria. The next step is to print test patterns with the current scanner C (i.e., the scanner to be tuned) and measure the resulting wafer data, thereby generating data WD_C. Next, all of the non-tunable parameters in model MP_K are fixed and the tunable parameters of model MP_K are adjusted so that the results of the model, now referred to as MP_KC, correspond to WD_C within some predefined error criteria. Then, in the final step of the process, the settings of scanner C are tuned from the current settings "PC", which were utilized to initial produce WD_C, to "PC+MP_K−MP_KC".

Figure 7:
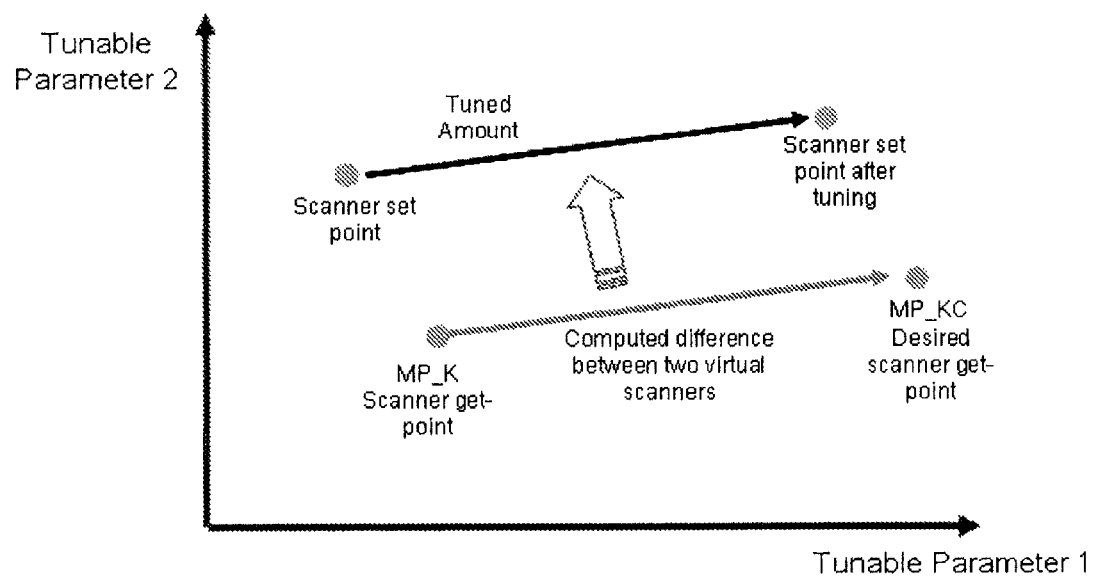
FIG. 7 illustrates a graphical representation of a second embodiment the method of an embodiment of the present invention.

This process can be useful for correction of drift (e.g., laser drift) within the scanner, and well as correction of drift in other lithography processes (e.g., resist process, etch process, etc.) The process is also useful for optimizing a given scanner for a given OPC process, where the OPC process is effectively incorporated into the model to which the scanner will be tuned. It is noted that it is possible to utilize an FEM model in the foregoing process as the reference model. Further, the model may consider both in focus and defocus conditions. A graphical representation of this process is illustrated in FIG. 7.

As noted above, it is also possible to utilize a wafer contour as the tuning target. This process is useful for optimizing a scanner for a specific device mask to optimize CDU (critical dimension uniformity), as well as for optimizing a scanner for a known mask error. The first step in the process is to image/print a specific device mask and measure the data, which is referred to as WD_M. The mask is imaged utilizing the scanner to be tuned, where the parameters of the scanner are initially set to nominal values "PC". It is noted that the target or desired wafer data, which obtains optimal CDU is referred to as WD_T. In the next step, utilizing a given model (as with the examples above, any suitable simulation model may be utilized) which is referred to as MP_C, the target pattern is processed by the model MP_C and produces simulated wafer data WD_C. Next, the tuning of the model MP_C to obtain the desired simulated imaging result, which is referred to as WD_CT, is determined by the equation:

$$WD\_CT = WD\_C + (WD\_T - T - WD\_M)$$

Figure 8:
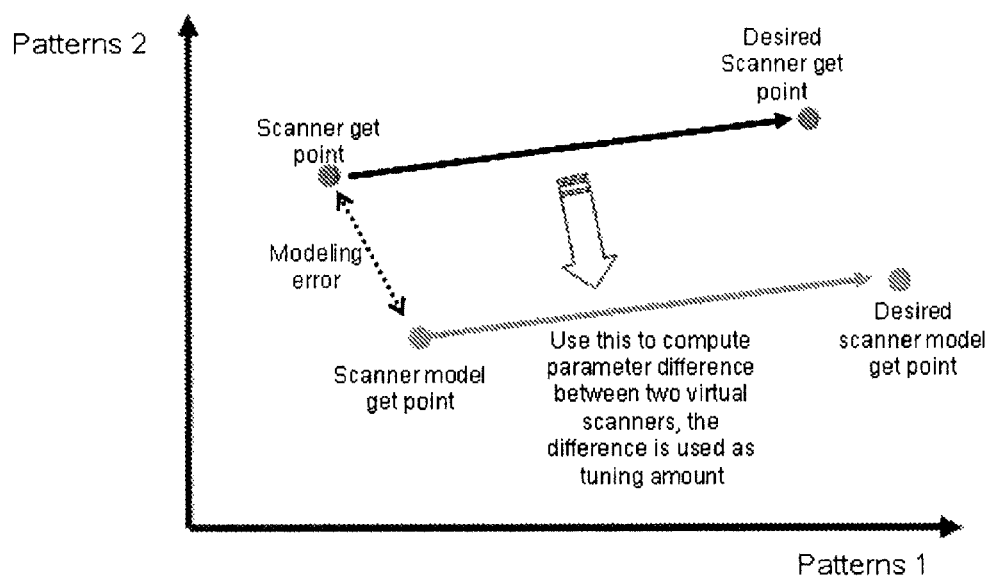
FIG. 8 illustrates a graphical representation of a third embodiment the method of an embodiment of the present invention.

Thereafter, all of the non-tunable parameters in model MP_C are fixed and the tunable parameters are tuned so that the model, which is now referred to as MP_CT, produces a simulated imaging result which corresponds to WD_CT. In the final step, the scanner to be tuned is tuned from the nominal settings of "PC" to PC+MP_CT−MP_C". FIG. 8 illustrates a graphical representation of the foregoing process.

It is noted that the foregoing process can be useful for optimizing CDU across the chip after the mask is made for a number of critical patterns. It is also noted that in the foregoing process, a limitation on the tuning may be necessary to prevent excessive tuning for the limited device patterns considered in the CDU. For example, a test pattern may be mixed in order to anchor the tuning process.

This third category of scanner tuning also allows for scanner optimization for a given mask error. More specifically, the process entails obtaining a current model with a known mask error, referred to as MP_M. It is noted that in the given example, MP_M is essentially the FEM with a known non-tunable parameter (mask error) changed by a known amount. Then, utilizing the model MP_M, without the mask error, simulate the test pattern (i.e., wafer contour) so as to obtain simulated wafer data with mask error, WD_T. Next, all non-tunable parameters in model MP_M are fixed, and the tunable parameters are adjusted such that the model, now referred to as MP_MT, produces a simulated imaging result based on the test pattern which corresponds to WD_T. In the final step, the scanner to be tuned is tuned from the nominal settings of "PC" to PC+MP_MT−MP_M". This process allows the scanner to be tuned to image a mask with a known systematic error.

As noted above, the model-based scanner tuning provides numerous advantages over prior art methods. Most importantly, an embodiment of the present invention provides a systematic and cost effective method for the optimization of imaging performance and OPE matching between different lithography systems, including scanners, which are being utilized to image the same target pattern. As a result, an embodiment of the present invention readily allows performance matching between different scanners of the same model as well as for performance matching between different model scanners.

Embodiments of the methods of the present invention also allow scanners to be tuned to a known model or a known wafer contour (i.e., target pattern). These processes allow for, among other things, lithography process drift corrections, scanner optimization for a given OPC process, scanner optimization for a specific device mask in order to optimize CDU and scanner optimization for a known mask error.

It is further noted that model separability is an important aspect of the model based tuning/matching/optimization process of an embodiment of the present invention. In other words, the total lithography behavior can be described accurately by adjusting only the tunable parameters. Brion's focus-exposure-model "FEM" achieves separability across focus-exposure process window variation. Further, FEM can also achieve model separability with respect to many other tunable parameters, such as, but not limited to, NA, illumination, etc., within a reasonable range of parameter change. If the tuning amount is too large such that it goes beyond the model separability range, the tuning can be achieved through two or more steps.

It is also noted that if desired, the effect of the tuning on the pattern can be analyzed using an OPC verification tool such as Tachyon's LMC (Lithographic Manufacturability Check), since the model can quantitatively analyze the impact of the changes to the model (i.e., tuning) on the full chip patterns. The procedure for performing this check is as follows. First, use LMC to simulate full chip on-wafer contour using the models before and after tuning. Next, compare the difference between the two contours to analyze the differences between the two.

With non-tunable parameters allowed to vary, it is also possible to quantitatively analyze the residual error's effect on the full chip pattern. The residual error is the difference between the after-tuning and tuning target. The can be accomplished by fitting the model for the wafer data, and allowing both tunable and non-tunable parameters to vary, i.e., fitting a full model based on the wafer data, and then using LMC to simulate full chip on-wafer contour using models which: (1) only allow tunable parameters to vary (i.e., the model coming out of the tuning procedure), and (2) allow both tunable and non-tunable parameters to vary (i.e., the model coming out of the above additional step). Once this is done, a comparison is made to identify the differences between the two contours. The difference between the contours is the residual error after tuning. If there are contour differences that are too large to be acceptable, the normal scanner tuning based on existing tunable parameters is unable to achieve the tuning goal. Additional actions may be taken to enable more parameters to be tunable, or scanner changes may be required.

Alternatives to the foregoing processes are also possible. As one example, when wafer data is available for both current scanner condition and tuning target condition, e.g., in the case of matching between two physical scanners without a prior model, an alternative embodiment is to perform joint calibration on the wafer data utilizing both current scanner condition and target scanner condition. This entails performing a joint model calibration process which allows non-tunable parameters to vary in the calibration process but forces them to be the same in both the current scanner condition and the target scanner condition, and which allows the tunable parameters to independently vary under both conditions. After the joint calibration, the difference between the tunable parameters of both conditions is the optimal tuning amount.

In an embodiment, there is provided a method of tuning a first lithography system utilizing a reference lithography system, the first lithography system and the reference lithography system each having tunable parameters for controlling imaging performance, the method comprising: defining a test pattern and an imaging model; imaging the test pattern utilizing the reference lithography system and measuring the imaging results; imaging the test pattern utilizing the first lithography system and measuring the imaging results; calibrating the imaging model utilizing the imaging results corresponding to the reference lithography system, the calibrated imaging model having a first set of parameter values; tuning the calibrated imaging model utilizing the imaging results corresponding to the first lithography system, the tuned calibrated model having a second set of parameter values; and adjusting the parameters of the first lithography system based on a difference between the first set of parameter values and the second set of parameter values.

In an embodiment, the first lithography system comprises a scanner. In an embodiment, the imaging model comprises fixed parameters. In an embodiment, the tunable parameters of the first lithography system correspond to the tunable parameters of the reference lithography system. In an embodiment, the tunable parameters of the first lithography system and the reference lithography system are set at a nominal value when imaging the test pattern.

In an embodiment, there is provided a method of tuning a lithography system utilizing an imaging model, the lithography system and the imaging model each having tunable parameters for controlling imaging performance, the method comprising: defining a test pattern; imaging a test pattern utilizing the lithography system and measuring the imaging results, the lithography system having a first set of parameter values; tuning the imaging model utilizing the imaging results corresponding to the lithography system, the tuned imaging model having a second set of parameter values; and adjusting the first set of parameters of the lithography system based on a difference between the first set of parameter values and the second set of parameter values.

In an embodiment, the lithography system comprises a scanner. In an embodiment, the imaging model further comprises fixed parameters. In an embodiment, the tunable parameters of the lithography system correspond to the tunable parameters of the imaging model. In an embodiment, the tunable parameters of the lithography system are set at a nominal value when imaging the test pattern.

In an embodiment, there is provided a method of tuning a lithography system utilizing a target pattern, the lithography system having tunable parameters for controlling imaging performance, the method comprising: defining an imaging model; imaging the target pattern utilizing the lithography system and measuring imaging results; simulating the imaging of the target pattern utilizing the imaging model and determining simulated imaging results, the imaging model having a first set of parameter values; determining target wafer data based on the simulated imaging results and a difference between the imaging results and the target pattern; tuning the imaging model utilizing the target wafer data, the tuned imaging model having a second set of parameter values; and adjusting the tunable parameters of the lithography system based on a difference between the first set of parameter values and the second set of parameter values.

In an embodiment, the lithography system comprises a scanner. In an embodiment, the imaging model comprises fixed parameters. In an embodiment, the tunable parameters of the lithography system correspond to tunable parameters of the imaging model. In an embodiment, the tunable parameters of the lithography system and the imaging model are initially set to nominal values.

Figure 9:
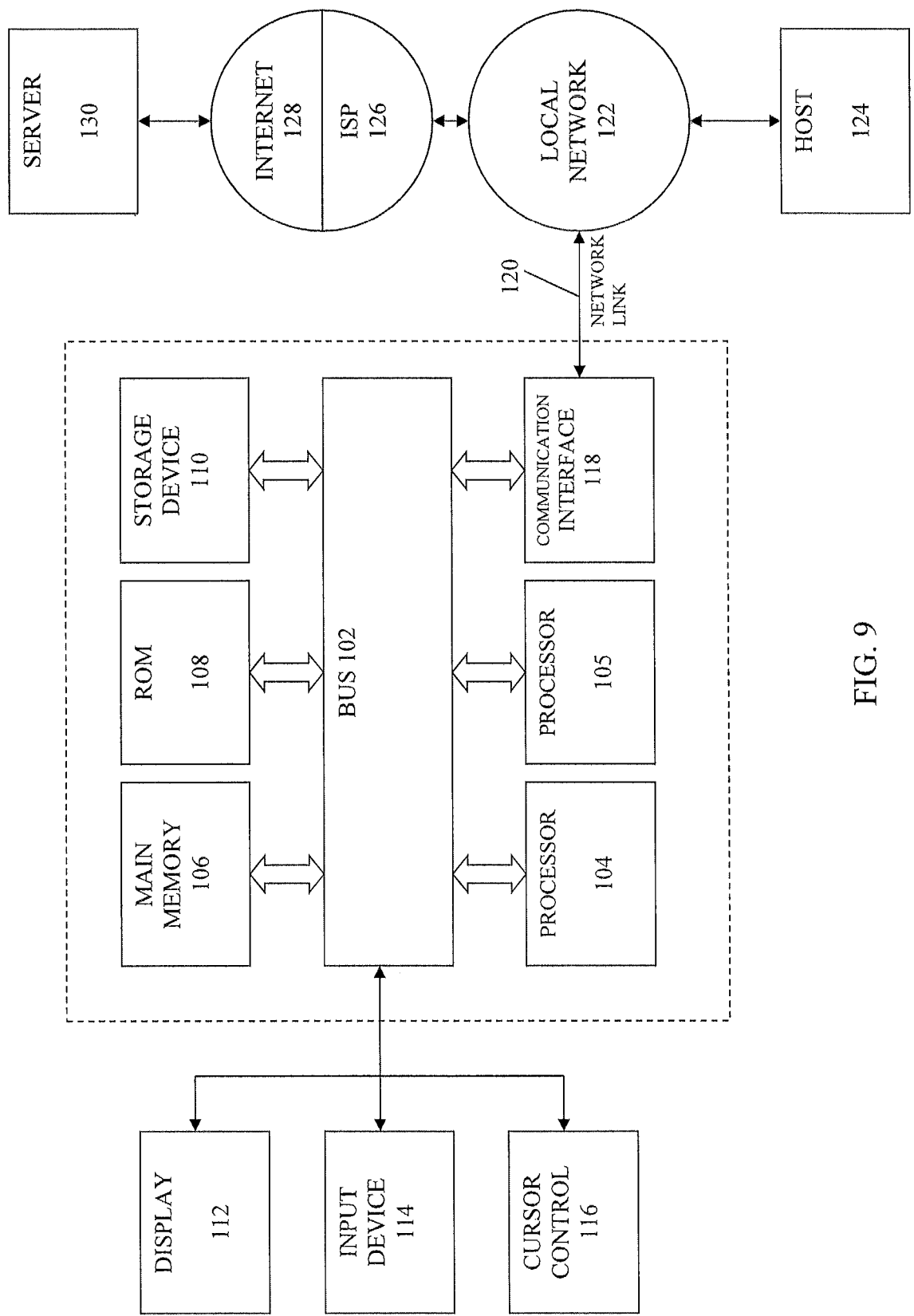
FIG. 9 is a block diagram that illustrates a computer system which can assist in the implementation of the model-based tuning process of an embodiment of the present invention.

FIG. 9 is a block diagram that illustrates a computer system 100 which can assist in the model-based scanner tuning method disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the scanner tuning process, for example, simulation operations, may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement an embodiment of the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal.

An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with an embodiment of the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 10:
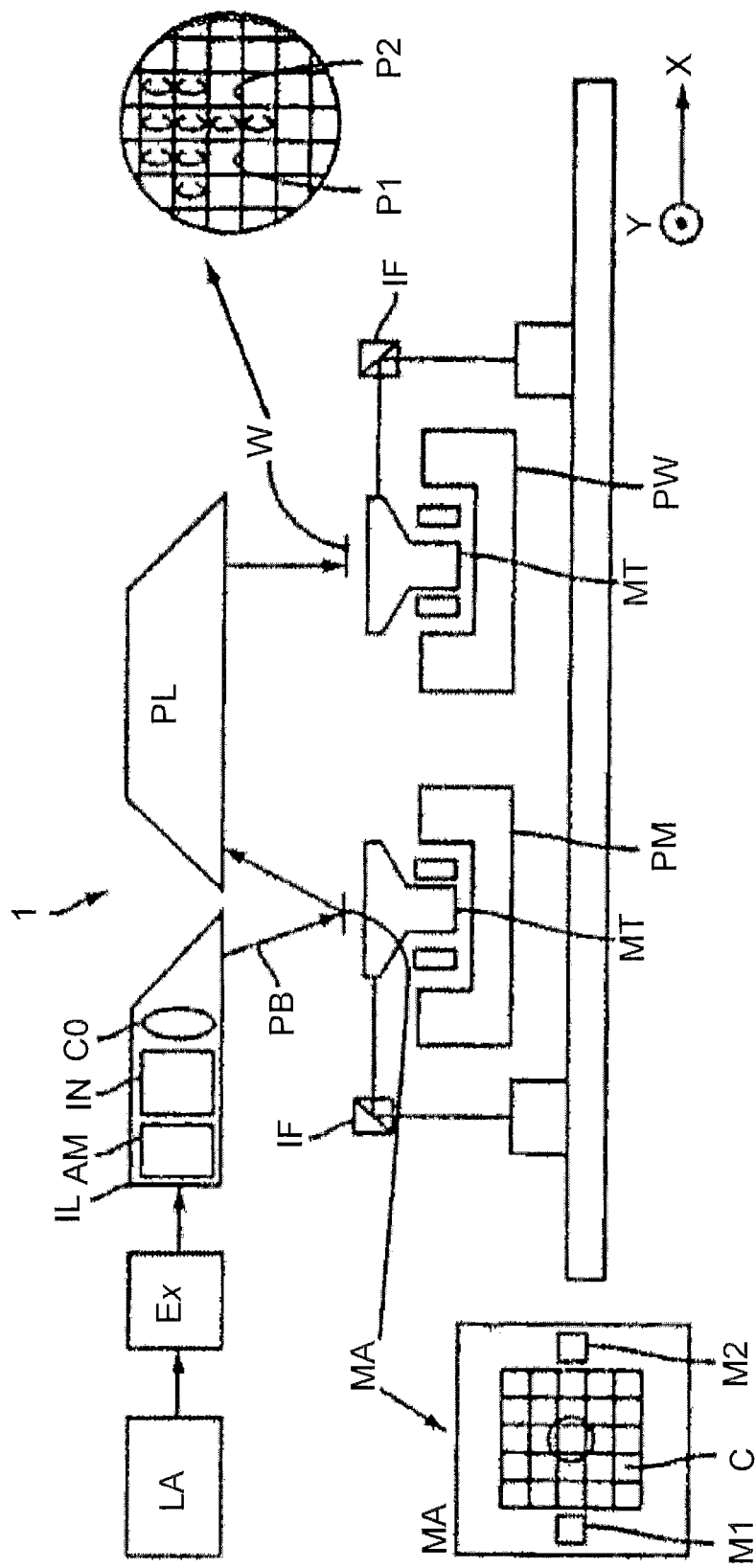
FIG. 10 schematically depicts a lithographic projection apparatus suitable for use with the method of an embodiment of the present invention.

FIG. 10 schematically depicts an exemplary lithographic projection apparatus that could be tuned utilizing the process of an embodiment of present invention. The apparatus, comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as $\sigma_r$-outer and $\sigma_r$-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 10 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or F2 lasing). An embodiment of the current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 10. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for improving lithography performance, the method comprising:
    obtaining an initial value of a parameter of a lithography system used for exposing a pattern;
    obtaining a measured result of the pattern from a substrate exposed using the lithography system at the initial value of the parameter;
    obtaining, by a hardware computer system, a simulated result of the pattern using a calibrated imaging model for the lithography system; and
    generating an adjusted lithography system setting to improve lithography performance, the generating comprising using a target lithography performance, the measured result, the simulated result and the initial value of the parameter.

2. The method according to claim 1, wherein generating the adjusted lithography system setting is conducted to reduce a difference in the lithography performance between a reference lithography system and the lithography system.

3. The method according to claim 1, wherein the target lithography performance is a target optical proximity effect.

4. The method according to claim 1, wherein the generating further comprises using information specific to a patterning device used in the lithography system.

5. The method according to claim 1, wherein the parameter comprises a spatial illumination parameter.

6. The method according to claim 1, wherein the generating comprises matching of optical proximity effects between a reference lithography system and the lithography system.

7. The method according to claim 1, wherein the measured result comprises critical dimension data.

8. The method according to claim 1, wherein generating the adjusted lithography system setting is conducted such that the adjusted lithography system setting enables the lithography system to realize, as a best match or within a certain error criteria, an imaging condition realized by another lithography system.

9. The method according to claim 1, wherein the model of the lithography system further comprises a resist parameter.

10. The method according to claim 1, wherein the generating of the adjusted lithography system setting comprises adjusting the initial value of the parameter.

11. A non-transitory computer readable medium comprising instructions, when executed by a hardware computer system, configured to cause at least:
    obtaining of an initial value of a parameter of a lithography system used for exposing a pattern;
    obtaining of a measured result of the pattern from a substrate exposed using the lithography system at the initial value of the parameter;
    obtaining of a simulated result of the pattern using a calibrated imaging model for the lithography system; and
    generation of an adjusted lithography system setting to improve lithography performance, the generation comprising using a target lithography performance, the measured result, the simulated result and the initial value of the parameter.

12. The computer readable medium according to claim 11, wherein generation of the adjusted lithography system setting is conducted to reduce a difference in the lithography performance between a reference lithography system and the lithography system.

13. The computer readable medium according to claim 11, wherein the target lithography performance is a target optical proximity effect.

14. The computer readable medium according to claim 11, wherein the generation further comprises using information specific to a patterning device used in the lithography system.

15. The computer readable medium according to claim 11, wherein the parameter comprises a spatial illumination parameter.

16. The computer readable medium according to claim 11, wherein the generation comprises matching of optical proximity effects between a reference lithography system and the lithography system.

17. The computer readable medium according to claim 11, wherein the measured result comprises critical dimension data.

18. The computer readable medium according to claim 11, wherein the model of the lithography system further comprises a resist parameter.

19. The computer readable medium according to claim 11, the generation of the adjusted lithography system setting comprises adjusting the initial value of the parameter.

20. A non-transitory computer readable medium comprising instructions, when executed by a hardware computer system, configured to cause at least:
obtaining of measurement results from a substrate exposed using a lithography system that is set using reference values;
obtaining of simulation results using a calibrated imaging model for the lithography system and the reference values; and
based at least on the simulation results and the measurement results, variance of a parameter of the lithography system that corresponds to the reference values such that a value of the varied parameter of the lithography system at least in part defines, as a best match or within an error criteria, a desired imaging condition of the lithography system.

21. The computer readable medium according to claim 20, further comprising instructions configured to cause performance of a simulation to arrive at the reference values that at least in part define a desired imaging condition of a pattern.

22. The computer readable medium according to claim 20, wherein at least one of the reference values comprises a spatial illumination parameter value.

23. The computer readable medium according to claim 20, wherein the variance comprises matching of optical proximity effects between a reference lithography system associated with the reference values and the lithography system.

24. The computer readable medium according to claim 20, wherein the model of the lithography system further comprises a resist parameter.

* * * * *